United States Patent
Karplus et al.

(10) Patent No.: US 11,942,757 B2
(45) Date of Patent: Mar. 26, 2024

(54) LASER PACKAGE WITH HIGH PRECISION LENS

(71) Applicant: Waymo LLC, Mountain View, CA (US)

(72) Inventors: Paul Karplus, Redwood City, CA (US); Matthew Last, San Jose, CA (US)

(73) Assignee: Waymo LLC, Mountain, CA (US)

( * ) Notice: Subject to any disclaimer, the term of this patent is extended or adjusted under 35 U.S.C. 154(b) by 566 days.

(21) Appl. No.: 17/152,026

(22) Filed: Jan. 19, 2021

(65) Prior Publication Data

US 2021/0143606 A1 May 13, 2021

Related U.S. Application Data

(62) Division of application No. 16/133,502, filed on Sep. 17, 2018, now Pat. No. 10,931,080.

(51) Int. Cl.
*H01S 5/022* (2021.01)
*H01S 5/02* (2006.01)
(Continued)

(52) U.S. Cl.
CPC ........ *H01S 5/02326* (2021.01); *H01S 5/0206* (2013.01); *H01S 5/02234* (2021.01);
(Continued)

(58) Field of Classification Search
CPC ............... H01S 5/02326; H01S 5/0206; H01S 5/02234; H01S 5/02253; H01S 5/02355; H01S 5/042; H01S 5/02345
See application file for complete search history.

(56) References Cited

U.S. PATENT DOCUMENTS

| 5,420,722 | A | | 5/1995 | Bielak |
| 5,516,727 | A | * | 5/1996 | Broom ................... H01L 33/58 |
| | | | | 257/E33.059 |

(Continued)

FOREIGN PATENT DOCUMENTS

| CN | 103258818 | 8/2013 |
| CN | 105789197 | 7/2016 |

(Continued)

OTHER PUBLICATIONS

International Searching Authority, International Search Report and Written Opinion dated Dec. 26, 2019, issued in connection with International Patent Application No. PCT/US2019/049729, filed on Sep. 5, 2019, 9 pages.

*Primary Examiner* — Yuanda Zhang
(74) *Attorney, Agent, or Firm* — McDonnell Boehnen Hulbert & Berghoff LLP

(57) ABSTRACT

The present disclosure relates to optical systems and methods for their manufacture. An example method includes coupling a first surface of a light-emitter substrate to a reference surface of a carrier substrate. The method also includes registering a mold structure with respect to the reference surface of the carrier substrate. Furthermore, the method includes using the mold structure to form an optical material over at least a portion of the light-emitter substrate. The optical material is shaped according to a shape of the mold structure and includes at least one registration feature. The method also includes coupling an optical lens element to the optical material such that the optical lens element is registered to the at least one registration feature.

20 Claims, 10 Drawing Sheets

(51) Int. Cl.
*H01S 5/02234* (2021.01)
*H01S 5/02253* (2021.01)
*H01S 5/02326* (2021.01)
*H01S 5/02355* (2021.01)
*H01S 5/042* (2006.01)
*H01S 5/02345* (2021.01)

(52) U.S. Cl.
CPC ...... *H01S 5/02253* (2021.01); *H01S 5/02355* (2021.01); *H01S 5/042* (2013.01); *H01S 5/02345* (2021.01)

(56) References Cited

U.S. PATENT DOCUMENTS

| | | | |
|---|---|---|---|
| 5,995,525 | A | 11/1999 | Kosugi |
| 7,358,109 | B2 | 4/2008 | Gallup et al. |
| 7,617,980 | B2 | 11/2009 | Saxena et al. |
| 2004/0258124 | A1 | 12/2004 | Lissotschenko |
| 2005/0079716 | A1 | 4/2005 | Yoshihara et al. |
| 2006/0067606 | A1 | 3/2006 | Towle et al. |
| 2006/0078262 | A1 | 4/2006 | Chen |
| 2007/0019702 | A1 | 1/2007 | Day et al. |
| 2009/0162957 | A1 | 6/2009 | Joung |
| 2010/0061418 | A1 | 3/2010 | Lambkin et al. |
| 2012/0001166 | A1 | 1/2012 | Doany et al. |
| 2013/0039374 | A1 | 2/2013 | Lutgen et al. |
| 2013/0256926 | A1 | 10/2013 | Dinesen |
| 2014/0269804 | A1 | 9/2014 | Lai et al. |
| 2015/0380896 | A1 | 12/2015 | Kimura et al. |
| 2017/0047312 | A1 | 2/2017 | Budd et al. |
| 2017/0368723 | A1* | 12/2017 | Faecke ............... B29D 11/0074 |
| 2019/0036299 | A1 | 1/2019 | Wojcik et al. |
| 2019/0252863 | A1 | 8/2019 | Chen et al. |

FOREIGN PATENT DOCUMENTS

| | | |
|---|---|---|
| DE | 102012215684 | 3/2014 |
| JP | 2004-349646 | 12/2004 |
| JP | 2006-0135498 | 12/2006 |
| JP | 2011137896 A | 7/2011 |
| KR | 2012-0056068 | 6/2012 |

* cited by examiner

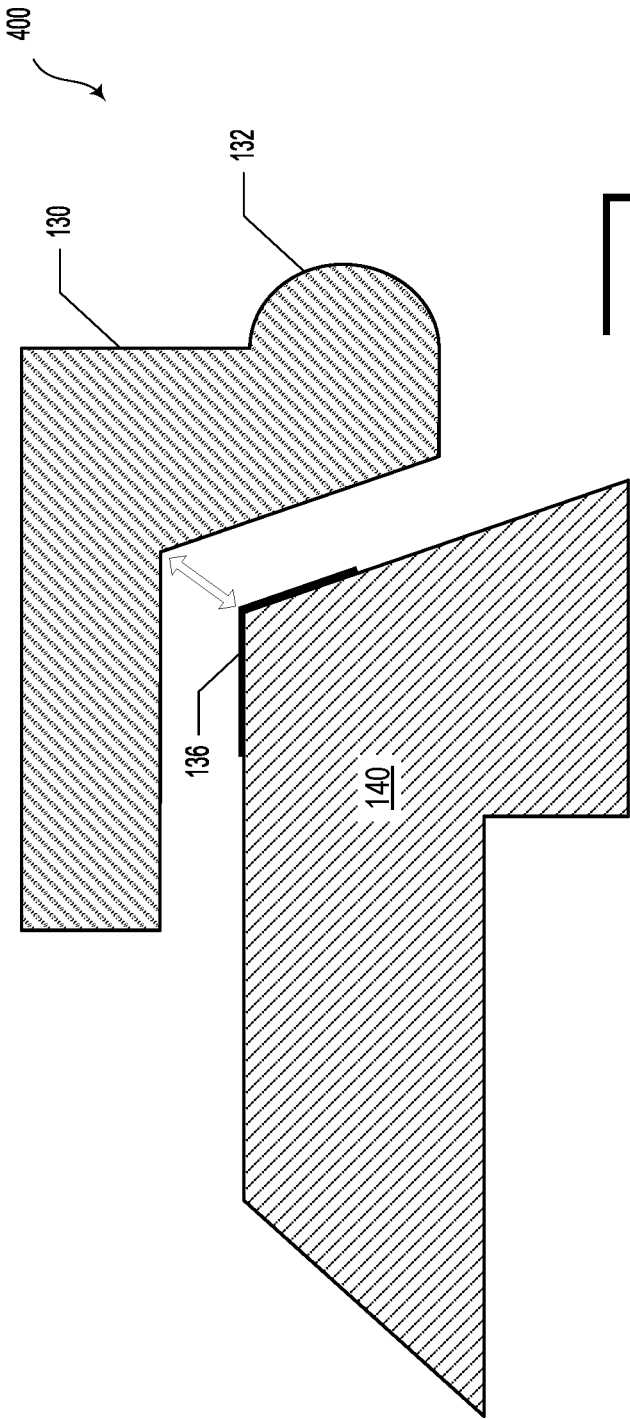

LASER PACKAGE WITH HIGH PRECISION LENS

CROSS-REFERENCE TO RELATED APPLICATION

The present application is a divisional of U.S. patent application Ser. No. 16/133,502, filed Sep. 17, 2018, the content of which is herewith incorporated by reference.

BACKGROUND

Unless otherwise indicated herein, the materials described in this section are not prior art to the claims in this application and are not admitted to be prior art by inclusion in this section.

Conventional optical systems may include light-emitter devices and other optical components that are combined together in a single physical package. In some cases, desired alignment tolerances between respective optical components within the package can be 100 microns, 50, microns, or less. Accordingly, there exists a need for reliable and repeatable manufacturing processes for packaging light-emitter devices and other optical components with high precision and within tight tolerance values.

SUMMARY

The present disclosure generally relates to optical systems that include light-emitter devices and lenses within a single package and the methods by which such optical systems could be manufactured. In some embodiments, such manufacturing methods may provide laser packages having accurate optical alignment in a repeatable manner and at a high rate of production.

In a first aspect, a method of manufacturing is provided. The method includes coupling a first surface of a light-emitter substrate to a reference surface of a carrier substrate. The method also includes registering a mold structure with respect to the reference surface of the carrier substrate. The method further includes, forming an optical material over at least a portion of the light-emitter substrate using the mold structure registered with respect to the reference surface. The optical material is formed according to a shape of the mold structure. The optical material includes at least one registration feature. The method also includes coupling an optical lens element to the optical material such that the optical lens element is registered to the at least one registration feature.

In a second aspect, a system is provided. The system includes a light-emitter substrate, which has a first surface. The system also includes a carrier substrate, which has a reference surface and a backside surface. The first surface of the light-emitter substrate is coupled to the reference surface of the carrier substrate. The system further includes an optical material, which covers at least a portion of the light-emitter substrate and is in contact with the reference surface. The optical material comprises at least one registration feature. The system yet further includes an optical lens element, which is coupled to the at least one registration feature. The system also includes a further substrate, which is coupled to the backside surface of the carrier substrate. The further substrate comprises a control circuit.

Other aspects, embodiments, and implementations will become apparent to those of ordinary skill in the art by reading the following detailed description, with reference where appropriate to the accompanying drawings.

BRIEF DESCRIPTION OF THE FIGURES

FIG. 4A illustrates a registration feature, according to an example embodiment.

FIG. 4B illustrates a registration feature, according to an example embodiment.

FIG. 4C illustrates a registration feature, according to an example embodiment.

FIG. 4D illustrates a registration feature, according to an example embodiment.

FIG. 4E illustrates a registration feature, according to an example embodiment.

FIG. 4F illustrates a registration feature, according to an example embodiment.

DETAILED DESCRIPTION

Example methods, devices, and systems are described herein. It should be understood that the words "example" and "exemplary" are used herein to mean "serving as an example, instance, or illustration." Any embodiment or feature described herein as being an "example" or "exemplary" is not necessarily to be construed as preferred or advantageous over other embodiments or features. Other embodiments can be utilized, and other changes can be made, without departing from the scope of the subject matter presented herein.

Thus, the example embodiments described herein are not meant to be limiting. Aspects of the present disclosure, as generally described herein, and illustrated in the figures, can be arranged, substituted, combined, separated, and designed in a wide variety of different configurations, all of which are contemplated herein.

Further, unless context suggests otherwise, the features illustrated in each of the figures may be used in combination with one another. Thus, the figures should be generally viewed as component aspects of one or more overall embodiments, with the understanding that not all illustrated features are necessary for each embodiment.

I. OVERVIEW

The present disclosure relates to methods for packaging a laser diode and optical lens in an efficient manner with high precision and repeatability. In some cases, a junction of the laser diode could be mounted on a surface of a substrate with its junction side down. Thereafter, at least a portion of the substrate and the laser diode are overmolded with an optically transparent material that is physically referenced and/or aligned to the substrate surface. The overmolded material has at least one registration feature. An optical lens (e.g., a fast-axis collimating lens) is placed over the overmolded material and in front of the laser diode. The optical lens could mate or otherwise align with the registration feature of the overmolded material so as to position the optical lens precisely in at least a vertical dimension with a tolerance of 10 microns or less.

In some embodiments, the substrate could be mounted to a printed circuit board with controlled-collapse solder balls (e.g., plastic core solder balls) that may control the height and orientation of the printed circuit board with respect to the substrate and/or the overall orientation and height of the package. In some cases, the printed circuit board may include one or more driver circuits for the laser diode.

Accordingly, the present application could provide a beneficial approach to packaging a laser diode and a fast axis collimating (FAC) lens, which may allow for more precise and repeatable manufacturing processes. Furthermore, by way of registration feature(s) and reference surface(s), such manufacturing processes may provide optical systems with more precision and at a higher production rate than using traditional processes.

II. EXAMPLE SYSTEMS

Figure 1:
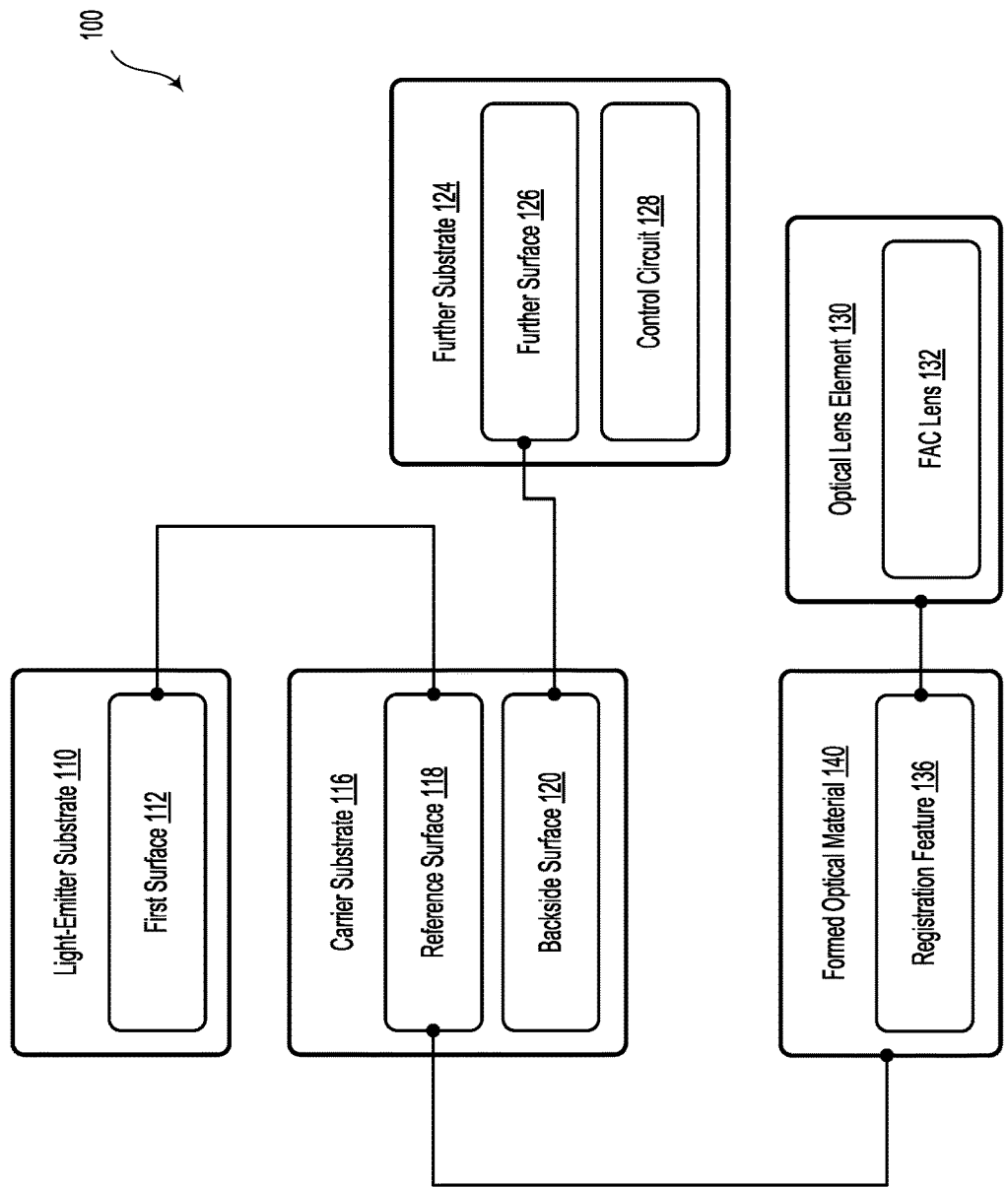
FIG. 1 illustrates a block diagram of a system, according to an example embodiment.

FIG. 1 illustrates a block diagram of an optical system 100, according to an example embodiment. Optical system 100 could be utilized in various compact physical mapping functionalities and other spatial awareness applications, which may include a LIDAR system or the like. For example, in some embodiments, the optical system 100 may be configured to provide information about a surrounding environment or objects therein. In some embodiments, the optical system 100 could provide important information to an automated or semi-automated vehicle or a plurality of such vehicles. For example, this information could be used to better enhance a self-driving car, an autonomous drone aircraft, an autonomous truck, or an autonomous robot generally. Other examples of vehicles and optical systems are contemplated herein.

Optical system 100 includes a light-emitter substrate 110 and a carrier substrate 116. The light-emitter substrate 110 could include a semiconductor material (e.g., silicon, GaAs, or the like). Additionally or alternatively, the light-emitter substrate 110 could include a different solid (e.g., crystalline or poly-crystalline) material. The light-emitter substrate 110 includes a first surface 112, which could include an epitaxially-grown surface of the light-emitter substrate 110. That is, in some embodiments, the first surface 112 could include a "top" surface formed subsequent to underlying epitaxial growth of a laser diode region.

The first surface 112 of the light-emitter substrate 110 is coupled to a reference surface 118 of the carrier substrate 116. The carrier substrate 116 could include a portion of a semiconductor wafer or a laminate printed circuit board. However, other materials having a reference surface are contemplated within the context of the present disclosure.

The reference surface 118 could include one of the principal surfaces of the carrier substrate 116. In such scenarios, the reference surface 118 could provide a reference plane for one or more elements of the optical system 100. For example, in some embodiments, the reference surface 118 of the carrier substrate 116 may be used to register a mold structure. In such scenarios, the mold structure could provide a mold (e.g., an injection mold) for forming an optical material with a desired shape. For example, the mold structure may provide a form for an optical material 140 that may cover at least a portion of the light-emitter substrate 110 and the carrier substrate 116.

In some embodiments, the optical material 140 may be formed with respect to the reference surface 118 of the carrier substrate 116. That is, the optical material 140 could be aligned to and/or otherwise physically referenced to the reference surface 118. In some embodiments, the reference surface 118 may include at least one mating feature 119 (e.g., v groove, notch, line or plane constraints, etc.) or one or more other alignment features. In such scenarios, the mating feature 119 could mate with the mold structure prior to forming the optical material 140. Other ways to align the mold structure and, ultimately, the optical material 140 to the reference surface 118 are possible and each is contemplated in the present disclosure.

In some embodiments, the optical material could include at least one of: a UV thermosetting material, an epoxy material, or a thermoplastic material. The optical material could include other types of materials. The optical material 140 may include at least one registration feature 136. The registration feature 136 may provide that the optical material 140 is physically registered with or aligned to an optical lens element 130 when coupled together. The optical lens element 130 may include, for example, a fast-axis collimation (FAC) lens 132.

The carrier substrate 116 includes a backside surface 120. For example, the backside surface 120 could be a principal surface of the carrier substrate 116 that is opposite the reference surface 118. In some embodiments, the backside surface 120 could be coupled to a further surface 126 of a further substrate 124.

The further substrate 124 may contain a control circuit 128, which could be configured to provide electrical signals (e.g., current and voltage pulses) to the light-emitter substrate 110. In some embodiments, the control circuit 128 could include one or more pulser circuits. In such examples, the one or more pulser circuits could include a plurality of gallium nitride metal-oxide semiconductor field effect transistors (GaN MOSFETs or GaN FETs). The plurality of GaN FETs could switch the current and voltage pulses on and off. Other types of circuits are possible and contemplated.

Figure 2:
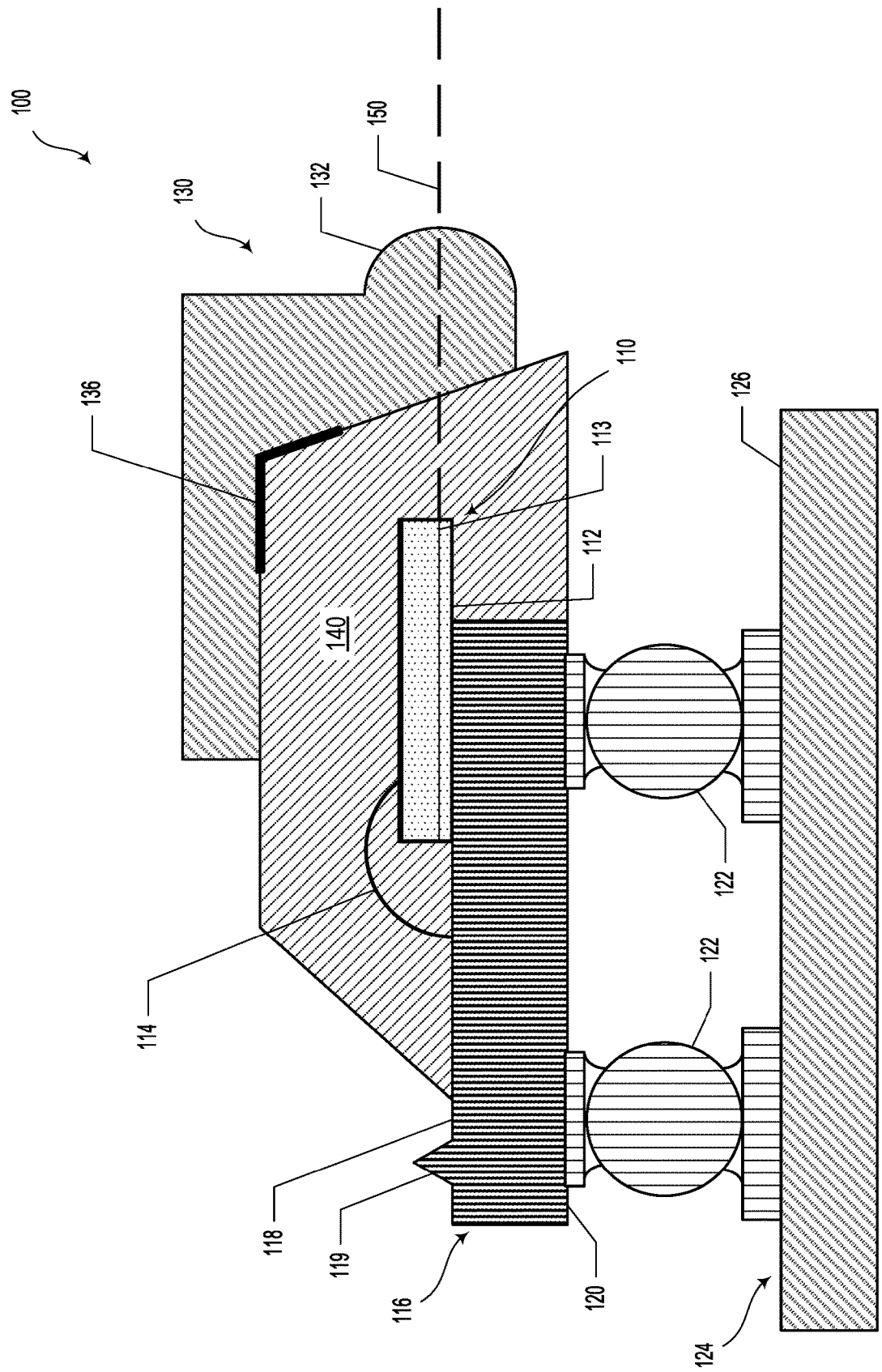
FIG. 2 illustrates a schematic diagram of a system, according to an example embodiment.

FIG. 2 illustrates a side view of the optical system 100, according to an example embodiment. As described above, the first surface 112 of the light-emitter substrate 110 is coupled to the reference surface 118 of the carrier substrate 116. Furthermore, the optical material 140 could overmold at least a portion of the reference surface 118 and the light-emitter substrate 110. Additionally, the FAC lens 132 is coupled to a registration feature 136 of the optical material 140. In some embodiments, the further surface 126 of the further substrate 124 may be coupled to the backside surface 120 of the carrier substrate 116 by one or more spacers 122.

In some embodiments, the light-emitter substrate 110 may be coupled to the reference surface 118 by one or more wirebonds 114. The light-emitter substrate 110 could additionally or alternatively be coupled to the reference surface 118 by way of bump bonding or application of a conductive adhesive.

The light-emitter substrate 110 may include at least one laser diode junction 113. For example, the light-emitter substrate 110 may include an epitaxially-grown laser diode region that may be configured to provide laser light in response to a current or voltage pulse. In some embodiments, the laser diode junction 113 could be formed from epitaxially-grown layers of InGaAs, GaAs, and/or other III/N materials. In some embodiments, the laser diode junction 113 could be located at a known distance from the first surface 112. In some embodiments, the laser diode junction 113 could be located between 1 and 20 microns from the first surface 112. Alternatively, the laser diode junction 113 could be located at a different distance from the first surface 112.

In some embodiments, the laser diode junction 113 could be located along an optical axis 150 of the FAC lens 132. As described elsewhere herein, the laser diode junction 113 could be configured to emit laser light toward the FAC lens 132. Furthermore, the FAC lens 132 could be configured to collimate the laser light emitted by the laser diode junction 113. In some embodiments, upon interaction with the FAC lens 132, the collimated light could be directed toward an optical waveguide structure. In an example embodiment, the optical waveguide structure may include a light guide manifold or another type of waveguide.

FIGS. 4A-4F illustrate various shapes, which could define registration feature 136. For example, FIG. 4A illustrates a registration feature 136 of the system 400, according to an example embodiment. The registration feature 136 of FIG. 4A may include an angled ridge with a cross-section having an angle (e.g., an angle that is greater than 90 degrees and less than 180 degrees) that may be used to register and/or align the optical lens element 130 to the optical material 140. In some embodiments, the registration feature 136 may include a shape different from that illustrated in FIG. 4A. For example, FIG. 4B illustrates a registration feature 136 with a right-angled cross-section, according to an example embodiment. Alternatively, FIG. 4C illustrates a registration feature 136 having an acute angle (e.g., an angle greater than 0 degrees and less than 90 degrees) cross-section, according to an example embodiment. As a further alternative, FIG. 4D illustrates a registration feature 136 having a curved cross-section, according to an example embodiment. Yet further, FIG. 4E illustrates a registration feature 136 having square or rectangular cross-section, according to an example embodiment. As another alternative, FIG. 4F illustrates a registration feature 136 having rounded hill-like cross-section, according to an example embodiment. It will be understood that the optical lens element 130 could be shaped so as to register, abut, and/or mate with the registration feature 136 of the optical material 140.

III. EXAMPLE METHODS

FIGS. 3A-3F illustrate various steps of a method of manufacture, according to one or more example embodiments. It will be understood that at least some of the various steps may be carried out in a different order than of that presented herein. Furthermore, steps may be added, subtracted, transposed, and/or repeated. FIGS. 3A-3F may serve as example illustrations for at least some of the steps or stages described in relation to method 500 as illustrated and described in relation to FIG. 5. Additionally, some steps of FIGS. 3A-3F may be carried out so as to provide optical system 100, as illustrated and described in reference to FIGS. 1 and 2.

Figure 3A:
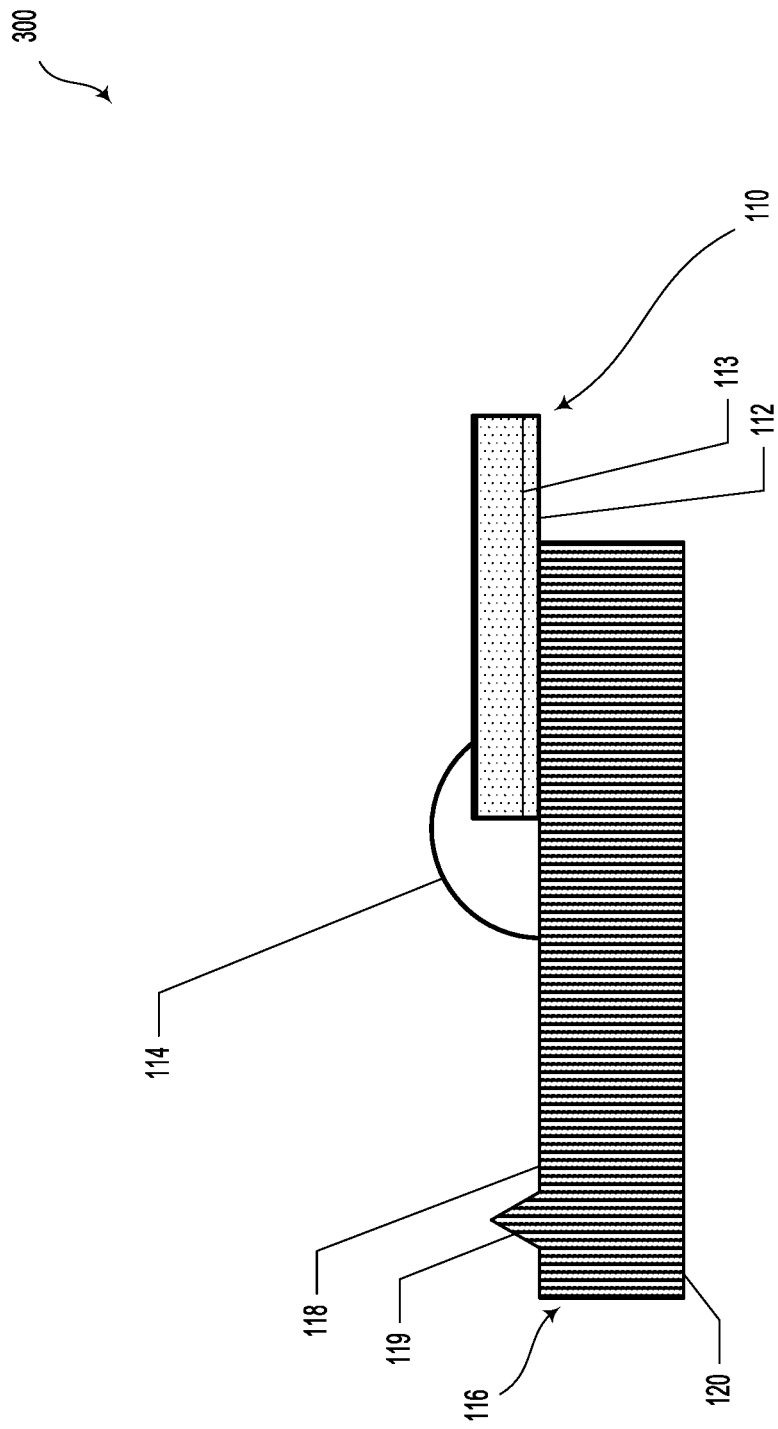
FIG. 3A illustrates a step in a manufacturing method, according to an example embodiment.

FIG. 3A illustrates a step 300 in a manufacturing method, according to an example embodiment. Step 300 includes providing a light-emitter substrate 110. Specifically, step 300 could include coupling a first surface 112 of a light-emitter substrate 110 to a reference surface 118 of a carrier substrate 116. As illustrated, the light-emitter substrate 110 could include an epitaxially-grown laser diode junction 113. In some embodiments, the laser diode junction 113 could be located at a known distance below the first surface 112 of the light-emitter substrate 110. The light-emitter substrate 110 could be coupled to the reference surface 118 of the carrier substrate 116 by at least one of: wire bonding, bump bonding, or application of a conductive adhesive. Other ways to couple the light-emitter substrate 110 to the reference surface 118 are contemplated and possible. In some embodiments, step 300 could include positioning the light-emitter substrate 110 onto the reference surface 118 relative to at least one alignment feature, such as mating feature 119 and/or one or more alignment marks. As an example, a pick and place tool could be used to position the light-emitter substrate 110 on the reference surface according to a plurality of alignment marks.

Figure 3B:
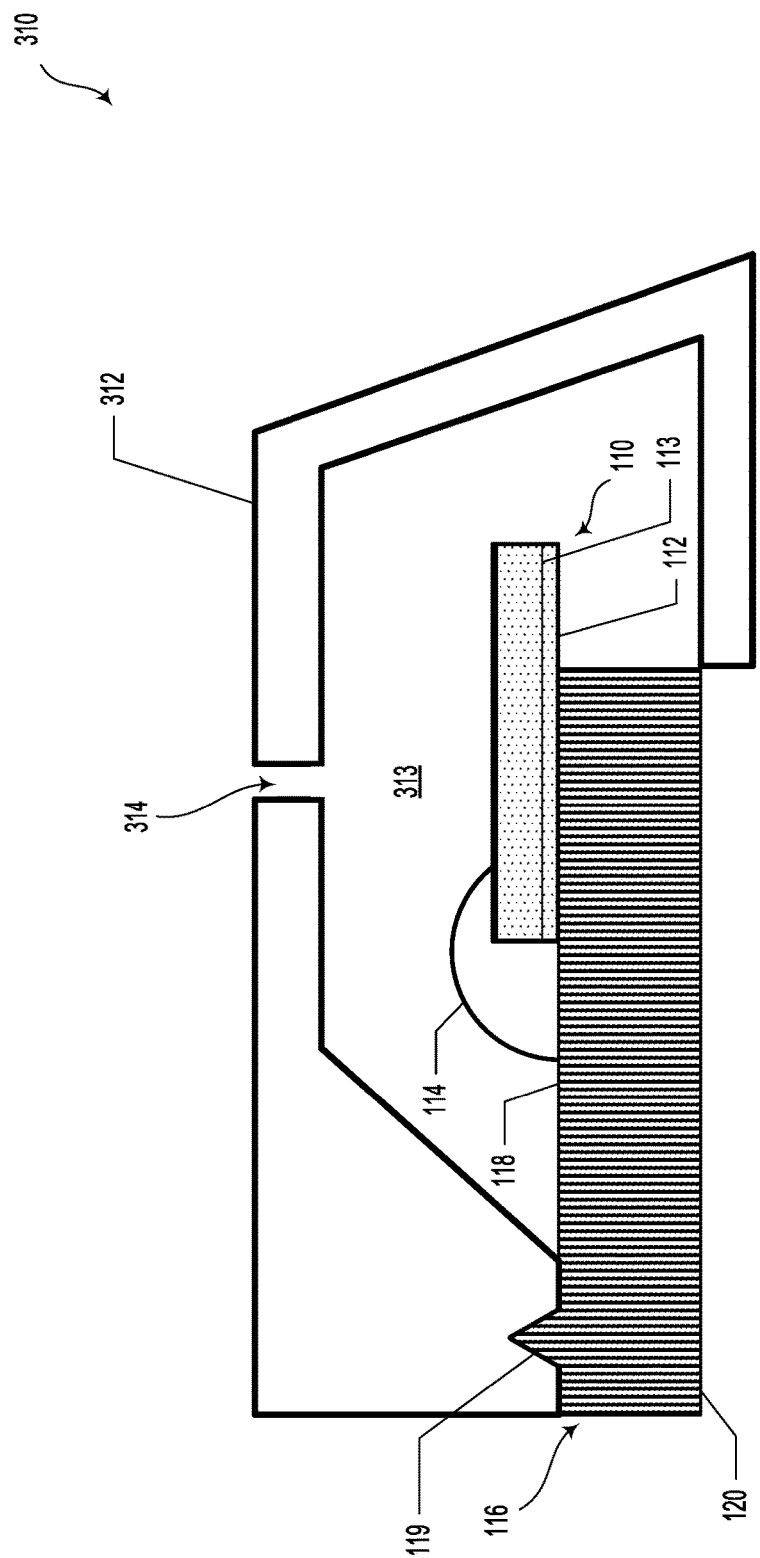
FIG. 3B illustrates a step in a manufacturing method, according to an example embodiment.

FIG. 3B illustrates a step 310 in a manufacturing method, according to an example embodiment. Step 310 includes registering a mold structure 312 with respect to the reference surface 118 of the carrier substrate 116. In an embodiment, step 310 could include providing the mold structure 312, which may include an interior volume 313 and at least one opening 314 that provides access to the interior volume 313. In some embodiments, the reference surface 118 of the carrier substrate 116 may include at least one mating feature 119. For instance, the mold structure 312 can register with the mating feature 119 and, in turn, provide a more reliable and consistent placement of the mold structure 312. In some embodiments, the mold structure may be registered with respect to a different element. For instance, the mold structure 312 could be registered with respect to the reference surface 118. In some embodiments, the optical material 140 may be injected, or otherwise introduced into the interior volume 313 through the opening 314. For example, an optical epoxy could be introduced into the interior volume 313 through the opening 314 and then cured so as to form a solidified optical material 140. In this way, the optical material 140 may be shaped according to a shape of the interior volume 313 of the mold structure 312.

Figure 3C:
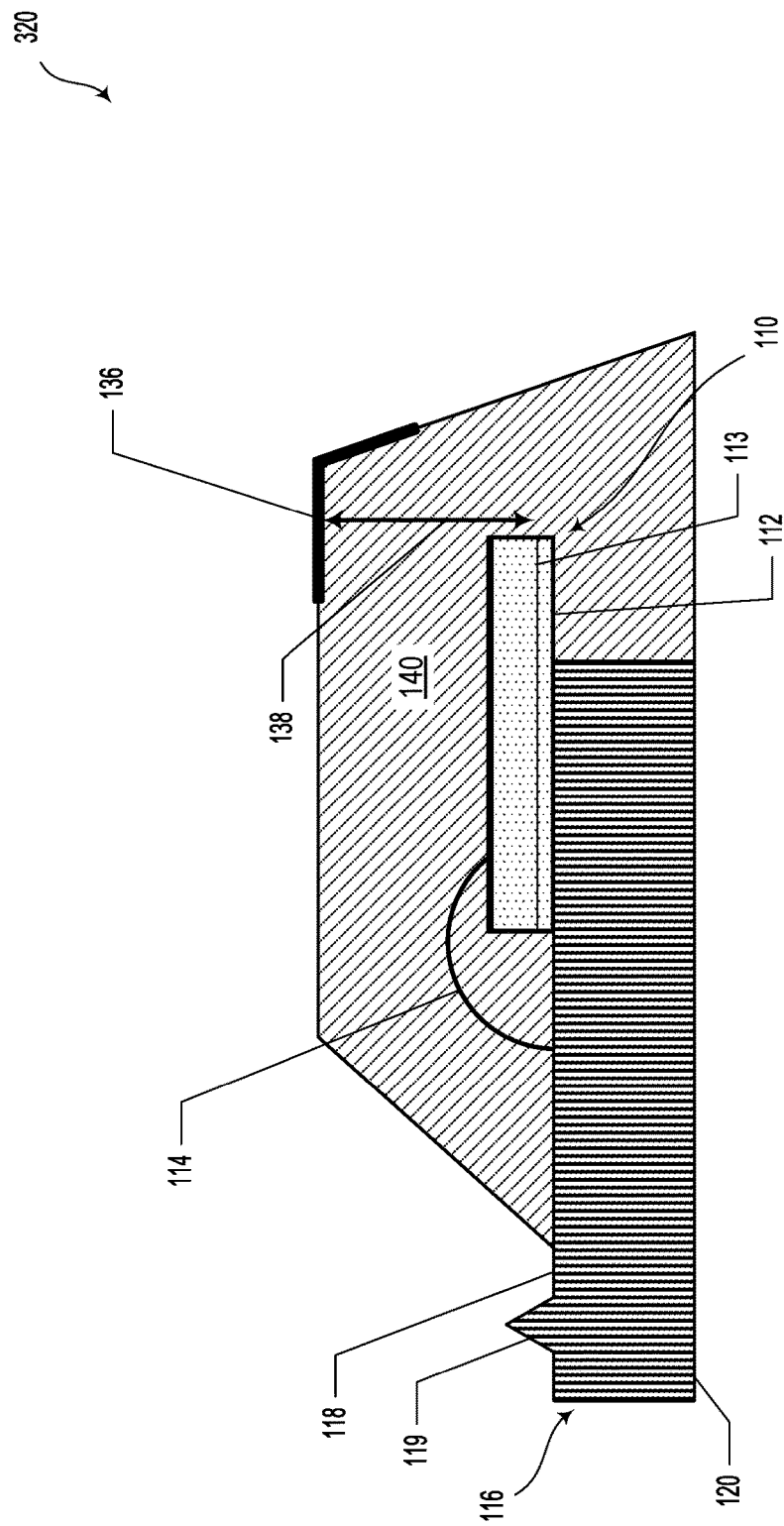
FIG. 3C illustrates a step in a manufacturing method, according to an example embodiment.

FIG. 3C illustrates a step 320 in a manufacturing method, according to an example embodiment. In step 320, the optical material 140 is formed over at least a portion of the light-emitter substrate 110 using the mold structure 312, and the mold structure 312 is then removed. As shown in FIG. 3C, the optical material 140 is shaped according to the shape of the interior volume 313 of the mold structure 312. Furthermore, the optical material 140 could include at least one registration feature 136. In some embodiments, the registration feature 136 includes at least one three-dimensional feature, which, in turn, includes at least one of: a ridge, a slot, an insert, an indent, a dimple, a hole, a post, a Vernier scale, a registration mark, or a mating feature. In some embodiments, the registration feature 136 may be at a known distance 138 with respect to the reference surface 118, the light-emitter substrate 110, and/or the epitaxially-grown laser diode region 113.

Figure 3D:
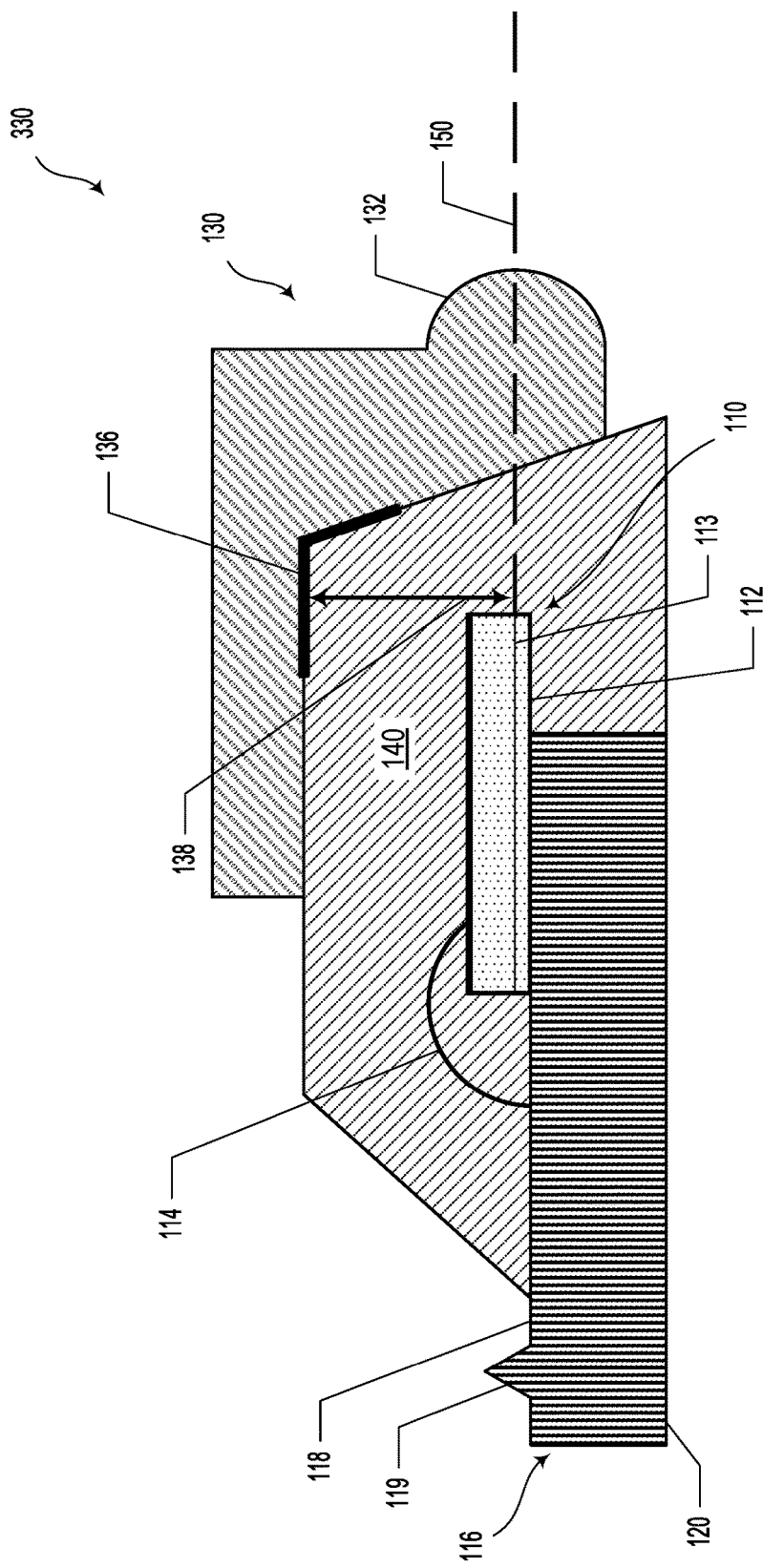
FIG. 3D illustrates a step in a manufacturing method, according to an example embodiment.

FIG. 3D illustrates a step 330 in a manufacturing method, according to an example embodiment. Step 330 includes registering an optical lens element 130 to the at least one registration feature 136. The at least one optical lens element 130 could include a fast-axis collimating (FAC) lens 132. Furthermore, step 330 could include, after registering the optical lens element 130 to the at least one registration feature 136, coupling the optical lens element 130 to the optical material 140. For example, the optical lens element 130 could be coupled to the optical material 140 by way of an optical epoxy, or another optically-transparent adhesive material. Additionally or alternatively, the optical lens element 130 and the optical material 140 could be coupled by way of a mechanical coupling (dovetail joint, interlocking members, etc.). As a result of registering and coupling the optical lens element 130 to the at least one registration feature 136, a pointing axis (e.g., a longitudinal axis) of the laser diode junction 113 of the light-emitter substrate 110 and the optical axis 150 may be positioned to within a predetermined tolerance value (e.g., within ten microns of one another). Additionally or alternatively, the pointing axis of the laser diode junction 113 could be positioned within a desired angle range or cone with respect to the optical axis 150 of the FAC lens 132.

In some embodiments, registering the optical lens element 130 to the at least one registration feature 136 includes registering a second mold structure to the at least one registration feature. The second mold structure could include an interior volume with a shape configured to form the FAC lens 132 and optical lens element 130 generally. Once the second mold structure is aligned to the registration feature 136, optical epoxy or some other material could be introduced into the second mold structure. The optical epoxy could be subsequently cured. In some embodiments, the cured optical epoxy could reflect the shape of the interior volume of the second mold structure.

Figure 3E:
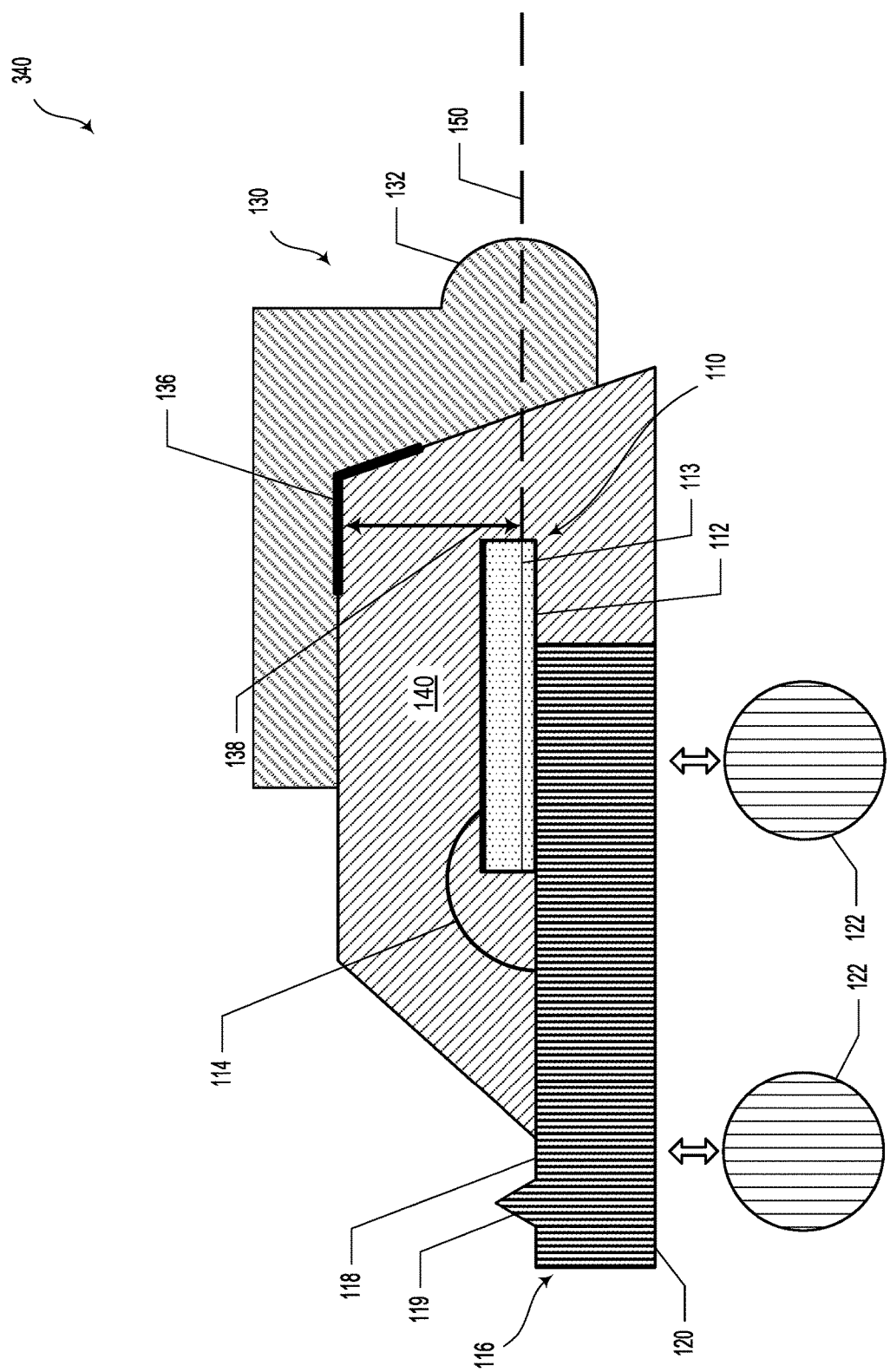
FIG. 3E illustrates a step in a manufacturing method, according to an example embodiment.

FIG. 3E illustrates a step 340 in a manufacturing method, according to an example embodiment. In some embodiments, step 340 includes coupling, during a first soldering operation, at least one spacer 122 to the backside surface 120 of the carrier substrate 116. In some embodiments, the at least one spacer 122 could include a controlled-collapse solder ball. That is, in an example embodiment, the at least one spacer 122 could be sintered, soldered, melted, physically pressed, or otherwise coupled to the backside surface 120 of the carrier substrate 116.

Figure 3F:
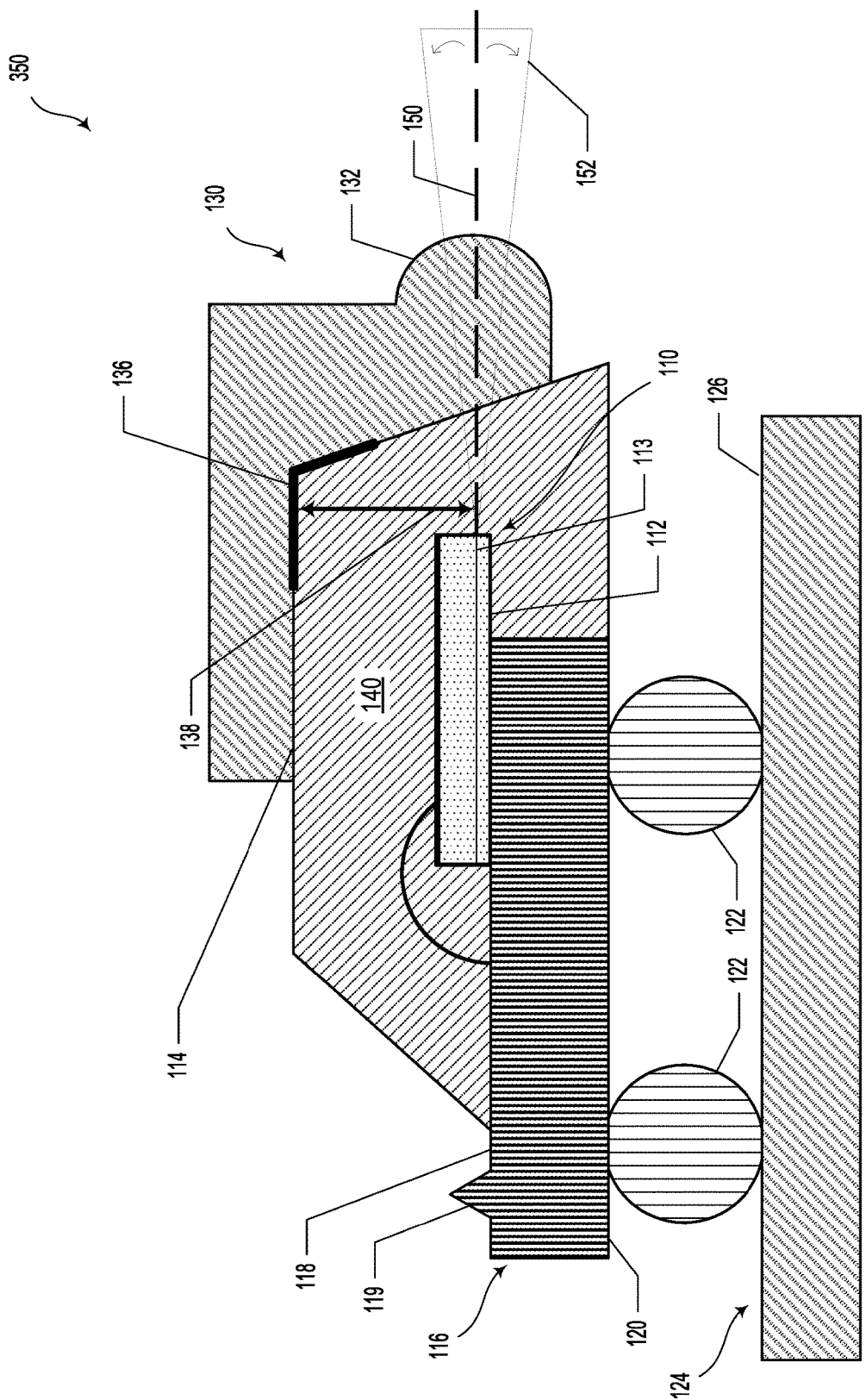
FIG. 3F illustrates a schematic diagram of a system, according to an example embodiment.

FIG. 3F illustrates a step 350 in a manufacturing method, according to an example embodiment. In a second solder operation, the ensemble illustrated in FIG. 3E could be attached to a further surface 126 of a further substrate 124. In an example embodiment, the further substrate 124 could include a laminate printed circuit board having one or more control circuits 128. As described elsewhere herein, the control circuits 128 could be configured to provide current/voltage pulses to the laser diode so as to cause the light-emitter substrate 110 to emit light pulses.

In some scenarios, the at least one spacer 122 could include one or more controlled-collapse solder balls with a plastic core. Such controlled-collapse solder balls could be configured to provide a standoff distance between the backside surface 120 of the carrier substrate 116 and the further surface 126 of the further substrate 124.

In some embodiments, the at least one spacer 122 could selected to position the light-emitter substrate 110 and laser diode region 113 so as to be in coaxial alignment with the optical axis 150 and/or within a predetermined tolerance value and/or angular range 152. In other words, the at least one laser diode junction 113 and the optical axis 150 of the optical lens element 130 are aligned within a tolerance value. In an example embodiment, the tolerance value is less than ten microns, as measured between the optical axis of the optical lens element and at least one of: an emission axis of the laser diode junction 113, an emission plane of the laser diode junction 113, or a known distance from the first surface 112 of the light-emitter substrate 110.

In some embodiments, the backside surface 120 of the carrier substrate 116 is coupled to the further substrate 124 using spacers 122. The spacers 122 are configured to maintain at least one of a desired height or a desired orientation of the carrier substrate 116 with respect to the further substrate 124. The spacers 122 include plastic core solder balls configured to, after melting, maintain the desired height between the carrier substrate 116 and the further substrate 124.

Figure 5:
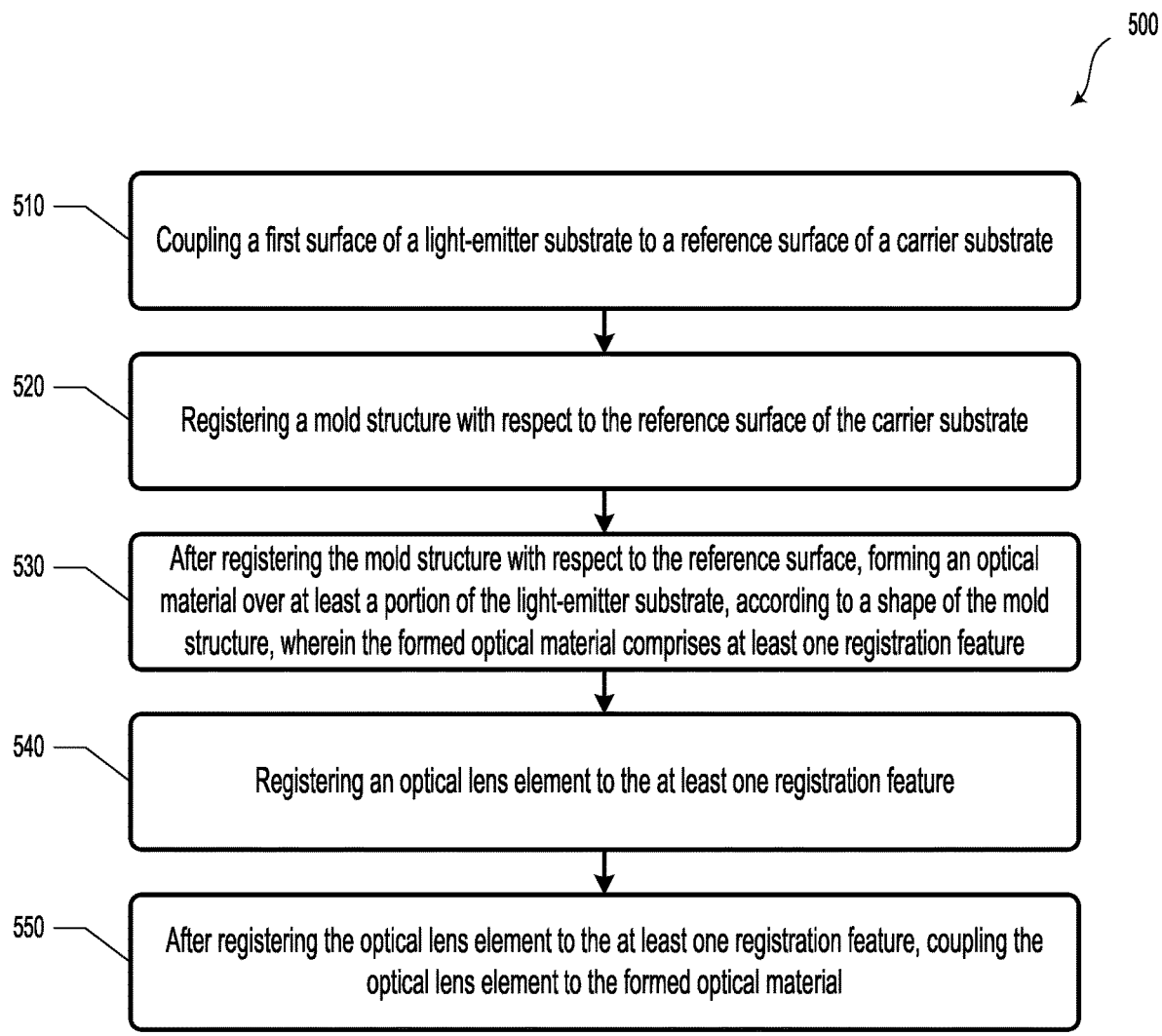
FIG. 5 illustrates a method, according to an example embodiment.

FIG. 5 illustrates a method 500, according to an example embodiment. Method 500 may be carried out, at least in part, by way of some or all of the manufacturing steps or blocks illustrated and described in reference to FIGS. 3A-3F. It will be understood that the method 500 may include fewer or more steps or blocks than those expressly disclosed herein. Furthermore, respective steps or blocks of method 500 may be performed in any order and each step or block may be performed one or more times. In some embodiments, method 500 and its steps or blocks may be performed to provide an optical system that could be similar or identical to optical system 100, as illustrated and described in reference to FIGS. 1 and 2.

Block 510 includes coupling a first surface 112 of a light-emitter substrate 110 to a reference surface 118 of a carrier substrate 116. As described herein, coupling the first surface 112 to the reference surface 118 could include applying an indium eutectic, one or more ball bonds, one or more wire bonds, an adhesive material, or other ways to physically couple two substrates.

Block 520 includes registering a mold structure 312 with respect to the reference surface 118 or mating feature 119 of the carrier substrate 116. In some embodiments, registering a mold structure 312 with respect to the reference surface 118 and/or the mating feature 119 could include performing a photolithography-based alignment (e.g., aligning alignment features on respective surfaces/structures). Other ways to physically align two structures are possible and contemplated.

Block 530 includes after registering the mold structure 312 with respect to the reference surface 118 or mating feature 119, forming an optical material 140 over at least a portion of the light-emitter substrate 110, according to a shape of the mold structure 312, wherein the optical material 140 comprises at least one registration feature 136. In some embodiments, forming the optical material 140 could include injecting an optical epoxy into the mold structure 312 and curing the optical epoxy. It will be understood that other ways to form optical material 140 (e.g., additive manufacturing techniques) are possible and contemplated.

Block 540 includes registering an optical lens element 130 to the at least one registration feature 136. In some embodiments, the optical lens element 130 could include a fast-axis collimation lens 132. Registering the optical lens element 130 to the registration feature 136 could provide one degree of freedom—into and out of the page. Other ways to register the optical lens system for zero degrees of freedom are possible and contemplated. Using such a registration feature could provide reliable alignment for a plurality of light-emitter devices. For example, returning to FIG. 2, a plurality of light-emitter substrates 110 could be provided along an axis running "into the page".

Block 550 includes, after registering the optical lens element 130 to the at least one registration feature 136, coupling the optical lens element 130 to the optical material 140. In such scenarios, coupling the optical lens element 130 to the optical material 140 could include, for example, utilizing an optical epoxy or another type of adhesive material.

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

A step or block that represents a processing of information can correspond to circuitry that can be configured to perform the specific logical functions of a herein-described method or technique. Alternatively or additionally, a step or block that represents a processing of information can correspond to a module, a segment, a physical computer (e.g., a field programmable gate array (FPGA) or application-specific integrated circuit (ASIC)), or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

While various examples and embodiments have been disclosed, other examples and embodiments will be apparent to those skilled in the art. The various disclosed examples and embodiments are for purposes of illustration and are not intended to be limiting, with the true scope being indicated by the following claims.

What is claimed is:

1. A method of manufacturing, the method comprising:
   coupling a first surface of a light-emitter substrate to a reference surface of a carrier substrate;
   registering a mold structure with respect to the reference surface of the carrier substrate;
   forming an optical material over at least a portion of the light-emitter substrate using the mold structure registered with respect to the reference surface, wherein the optical material is shaped according to a shape of the mold structure, and wherein the optical material comprises at least one registration feature; and
   coupling an optical lens element to the optical material such that the optical lens element is registered to the at least one registration feature and an optical axis of the optical lens element extends through the optical material to the light-emitter substrate.

2. The method of claim 1, wherein coupling the first surface of the light-emitter substrate to the reference surface of the carrier substrate comprises at least one of: wire bonding, bump bonding, or application of a conductive adhesive.

3. The method of claim 1, wherein the light-emitter substrate comprises at least one laser diode junction.

4. The method of claim 3, wherein the at least one laser diode junction is located at a known distance from the first surface.

5. The method of claim 3, wherein coupling the optical lens element to the optical material comprises aligning the at least one laser diode junction with the optical axis of the optical lens element.

6. The method of claim 5, wherein the at least one laser diode junction and the optical axis of the optical lens element are aligned within a tolerance value, wherein the tolerance value is less than ten microns as measured between the optical axis of the optical lens element and at least one of: an emission axis of the laser diode junction, an emission plane of the laser diode junction, or a known distance from the first surface of the light-emitter substrate.

7. The method of claim 5, wherein the at least one laser diode junction and the optical axis of the optical lens element are aligned such that a pointing axis of the at least one laser diode junction is positioned within a desired angle range with respect to the optical axis of the optical lens element.

8. The method of claim 5, wherein the at least one laser diode junction and the optical axis of the optical lens element are aligned such that a pointing axis of the at least one laser diode junction is positioned within a desired cone with respect to the optical axis of the optical lens element.

9. The method of claim 1, wherein the optical lens element comprises a fast axis collimating (FAC) lens.

10. The method of claim 1, wherein the at least one registration feature comprises at least one three-dimensional feature, wherein the three-dimensional feature comprises at least one of: a ridge, a slot, an insert, an indent, a dimple, a hole, a post, a Vernier scale, a registration mark, or a mating feature.

11. The method of claim 1, wherein the at least one registration feature is at a known distance with respect to at least one of the reference surface or the first surface.

12. The method of claim 1, wherein coupling the optical lens element to the optical material such that the optical lens element is registered to the at least one registration feature comprises:
    registering a second mold structure to the at least one registration feature; and
    forming the optical lens element using the second mold structure registered to the at least one registration feature.

13. The method of claim 1, wherein the carrier substrate comprises a backside surface opposite the reference surface, further comprising coupling the backside surface of the carrier substrate to a further substrate.

14. The method of claim 13, wherein the backside surface of the carrier substrate is coupled to the further substrate using spacers, wherein the spacers are configured to maintain at least one of a desired height or a desired orientation of the carrier substrate with respect to the further substrate.

15. The method of claim 14, wherein the spacers comprise plastic core solder balls configured to, after melting, maintain the desired height or the desired orientation between the carrier substrate and the further substrate.

16. The method of claim 13, wherein the further substrate comprises a control circuit.

17. The method of claim 1, wherein forming an optical material over at least a portion of the light-emitter substrate comprises applying at least one of: a UV thermosetting material, an epoxy material, or a thermoplastic material over the at least a portion of the light-emitter substrate.

18. The method of claim 1, further comprising:
after forming the optical material over at least the portion of the light-emitter substrate, removing the mold structure.

19. The method of claim 1, wherein coupling the optical lens element to the optical material such that the optical lens element is registered to the at least one registration feature comprises coupling the optical lens element to the optical material by way of an optically-transparent adhesive material.

20. The method of claim 1, wherein coupling the optical lens element to the optical material such that the optical lens element is registered to the at least one registration feature comprises coupling the optical lens element to the optical material by way of a mechanical coupling.

* * * * *